(12) United States Patent
Shiraishi et al.

(10) Patent No.: US 7,884,632 B2
(45) Date of Patent: Feb. 8, 2011

(54) SEMICONDUCTOR INSPECTING DEVICE

(75) Inventors: Akinori Shiraishi, Nagano (JP); Mitsutoshi Higashi, Nagano (JP); Kei Murayama, Nagano (JP); Katsunori Yamagishi, Nagano (JP); Mitsuhiro Aizawa, Nagano (JP)

(73) Assignee: Shinko Electric Electric Industries Co., Ltd., Nagano-shi, Nagano (JP)

( * ) Notice: Subject to any disclaimer, the term of this patent is extended or adjusted under 35 U.S.C. 154(b) by 0 days.

(21) Appl. No.: 12/370,072

(22) Filed: Feb. 12, 2009

(65) Prior Publication Data
US 2009/0206861 A1 Aug. 20, 2009

(30) Foreign Application Priority Data
Feb. 13, 2008 (JP) .................... 2008-031896

(51) Int. Cl.
*G01R 31/02* (2006.01)
*G01R 31/26* (2006.01)

(52) U.S. Cl. .............. 324/758; 324/754; 324/761; 324/765

(58) Field of Classification Search .......... 324/754–765
See application file for complete search history.

(56) References Cited

U.S. PATENT DOCUMENTS

| | | | | |
|---|---|---|---|---|
| 5,926,028 | A * | 7/1999 | Mochizuki | 324/762 |
| 6,498,504 | B2 * | 12/2002 | Miyagi | 324/754 |
| 6,528,984 | B2 * | 3/2003 | Beaman et al. | 324/158.1 |
| 7,268,568 | B2 * | 9/2007 | Machida et al. | 324/754 |
| 7,336,087 | B2 * | 2/2008 | Korting et al. | 324/758 |
| 2005/0024070 | A1 * | 2/2005 | Miller | 324/754 |
| 2007/0200572 | A1 * | 8/2007 | Breton et al. | 324/754 |

FOREIGN PATENT DOCUMENTS

JP   2001-91543   4/2001

* cited by examiner

*Primary Examiner*—Ha Tran T Nguyen
*Assistant Examiner*—Emily Y Chan
(74) *Attorney, Agent, or Firm*—Drinker Biddle & Reath LLP

(57) ABSTRACT

In a semiconductor inspecting device having a contact to be electrically connected to an electrode pad formed in a semiconductor device which is an object to be measured, and a substrate provided with the contact, the contact is provided obliquely to a main surface of the substrate.

5 Claims, 14 Drawing Sheets

SEMICONDUCTOR INSPECTING DEVICE

TECHNICAL FIELD

The present disclosure relates to a semiconductor inspecting device for causing a plurality of contacts to come in contact with electrode pads of a semiconductor device, thereby inspecting an electrical characteristic of the semiconductor device.

RELATED ART

In a process for inspecting a semiconductor device, there has been carried out a probing inspection for directly pressing a tip of a contact (a probe) of a semiconductor inspecting device against an electrode pad of the semiconductor device formed on a semiconductor wafer and thus connecting an external testing device to the semiconductor device temporarily and electrically, thereby discriminating quality of a conduction between respective circuits. There have been also carried out a burn-in inspection for giving a thermal and electrical stress to a circuit at a high temperature, thereby selecting a defective acceleratingly, and an electrical characteristic inspection such as a final inspection for finally performing an inspection at a high frequency.

In recent years, referring to the semiconductor device, the number of electrode pads to be formed in the semiconductor device is increased (the number of pins is increased) with an enhancement in an integration of a semiconductor element and an increase in the number of processing signals, and furthermore, a reduction in a pitch of the electrode pad is advanced. Consequently, it has been necessary to increase the number of pins and to reduce a pitch also in a contact (probe) of a semiconductor inspecting device for inspecting an electrical characteristic of the semiconductor device.

FIG. 1 is a sectional view illustrating a related-art semiconductor inspecting device 100. With reference to FIG. 1, the semiconductor inspecting device 100 has a support board 101, a relay board 102, a connecting terminal 103, and a probe 104. A semiconductor device 108 has an electrode pad 109. FIG. 2 is a perspective view illustrating the probe 104 constituting the related-art semiconductor inspecting device 100. In FIG. 2, the same components as those in FIG. 1 have the same reference numerals and description thereof will be omitted.

With reference to FIGS. 1 and 2, the relay board 102 is provided on a lower surface of the support board 101 in the semiconductor inspecting device 100. A predetermined wiring (not shown) is formed on the support board 101 and the relay board 102, and the wiring (not shown) of the relay board 102 and an electrode pad 104g of the probe 104 are electrically connected to each other through the connecting terminal 103 formed by a solder ball. The wiring (not shown) of the support board 101 is electrically connected to an external testing device (not shown) through a cable (not shown).

The probe 104 has a probe forming board 104a, a ground layer 104b, an insulating layer 104c, and a wiring 104d. The probe 104 also has a protruded portion 104e and a cantilever portion 104f. In the probe 104, the ground layer 104b, the insulating layer 104c and the wiring 104d are sequentially laminated on the probe forming board 104a. The probe forming board 104a is formed of silicon.

The cantilever portion 104f which can easily be deformed is formed in the probe 104, and the protruded portion 104e is formed in a tip part of the cantilever portion 104f and the vicinity thereof. The probe forming board 104a is continuously provided with the wiring 104d through the ground layer 104b and the insulating layer 104c from the protruded portion 104e to the electrode pad 104g formed on a surface at an opposite side to a surface on which the protruded portion 104e is formed, along the tip part of the cantilever portion 104f.

The electrode pad 104g is formed in a position in which a connection to the connecting terminal 103 can be carried out, and the electrode pad 104g and the connecting terminal 103 are electrically connected to each other. The semiconductor inspecting device 100 has a mechanism (not shown) which can be moved in a Z-Z direction. In an inspection of an electrical characteristic of the semiconductor device 108, the semiconductor inspecting device 100 is moved toward the semiconductor device 108 side in the Z-Z direction, and the wiring 104d in the protruded portion 104e of the semiconductor inspecting device 100 is electrically connected to the electrode pad 109 of the semiconductor device 108 which is an object to be measured.

In this case, the cantilever portion 104f is deflected so that a spring property is generated and the wiring 104d in the protruded portion 104e can be pushed against the electrode pad 109 at a proper pressure. Thus, a stable and electrical connection can be implemented. A quantity of the deflection of the cantilever portion 104f is approximately 10 μm, for example.

In the semiconductor inspecting device 100, four probes are provided in an X-X direction. In the probe 104, moreover, four sets of protruded portions 104e and cantilever portions 104f are provided in a Y-Y direction. Accordingly, the protruded portions 104e can be simultaneously and electrically connected to 16 electrode pads 109 in the semiconductor device 108 which is the object to be measured.

By providing five or more probes 104 in the X-X direction in the semiconductor inspecting device 100 or providing five or more sets of protruded portions 104e and cantilever portions 104f in the Y-Y direction in the probe 104, it is also possible to increase the number of the protruded portions 104e which can be connected to the electrode pad 109 simultaneously and electrically (for example, see Patent Document 1).

[Patent Document 1] JP-A-2001-91543 Publication

Although it is easy to increase the number of pins and to reduce a pitch in the Y-Y direction in FIG. 2 over the protruded portion 104e of the probe 104 in the related-art semiconductor inspecting device 100, however, there is employed a structure in which the wiring 104d of the protruded portion 104e and the electrode pad 109 are electrically connected to each other at a pressure generated by the spring property through the deflection of the cantilever portion 104f. For this reason, there is a problem in that at least a predetermined length is required for the cantilever portion 104f and it is hard to increase the number of the pins and to reduce the pitch in the X-X direction in FIG. 1 over the protruded portion 104e of the probe 104.

SUMMARY

Exemplary embodiments of the present invention provide a semiconductor inspecting device having a probe structure which can increase the number of pins and to reduce a pitch in X-X and Y-Y directions.

A first aspect of the invention is directed to a semiconductor inspecting device comprising:

a contact to be electrically connected to an electrode pad formed in a semiconductor device which is an object to be measured; and a substrate provided with the contact, wherein the contact is provided obliquely to a main surface of the substrate.

A second aspect of the invention is directed to the semiconductor inspecting device according to the first aspect of the invention, wherein a plurality of contacts is provided in a matrix over the main surface of the substrate.

A third aspect of the invention is directed to the semiconductor inspecting device according to the second aspect of the invention, wherein the contacts corresponding to a single row or column are formed integrally.

A fourth aspect of the invention is directed to the semiconductor inspecting device according to any of the first to third aspects of the invention, wherein the contact has a substrate formed by a single silicon crystal, an insulating layer formed on the substrate, and a wiring is formed on the insulating layer.

A fifth aspect of the invention is directed to the semiconductor inspecting device according to the fourth aspect of the invention, wherein the wiring is electrically connected, through wire bonding, to a wiring formed on the main surface of the substrate.

A sixth aspect of the invention is directed to the semiconductor inspecting device according to any of the first to fifth aspects of the invention, further comprising:

a contact positioning portion having a through hole.

A seventh aspect of the invention is directed to the semiconductor inspecting device according to the sixth aspect of the invention, wherein a plurality of contacts is provided in a matrix over the main surface of the substrate, and wherein a plurality of through holes is provided in a matrix in order to separate the respective contacts from each other.

An eighth aspect of the invention is directed to the semiconductor inspecting device according to the sixth aspect of the invention, wherein a plurality of contacts is provided in a matrix over the main surface of the substrate, and wherein a plurality of through holes is formed like a slit in order to separate the contacts corresponding to one row or column from each other.

A ninth aspect of the invention is directed to the semiconductor inspecting device according to any of the sixth to eighth aspects of the invention, wherein the contact positioning portion functions as a stopper for preventing an interval between the substrate and the semiconductor device from being smaller than a predetermined value.

A tenth aspect of the invention is directed to the semiconductor inspecting device according to any of the first to ninth aspects of the invention, further comprising:

a resistor provided on at least one of the contact or the substrate.

According to the invention, it is possible to provide a semiconductor inspecting device having a probe structure which can increase the number of pins and to reduce a pitch in X-X and Y-Y directions.

DETAILED DESCRIPTION

Next, an embodiment according to the invention will be described with reference to the drawings.

First Embodiment

Figure 1:
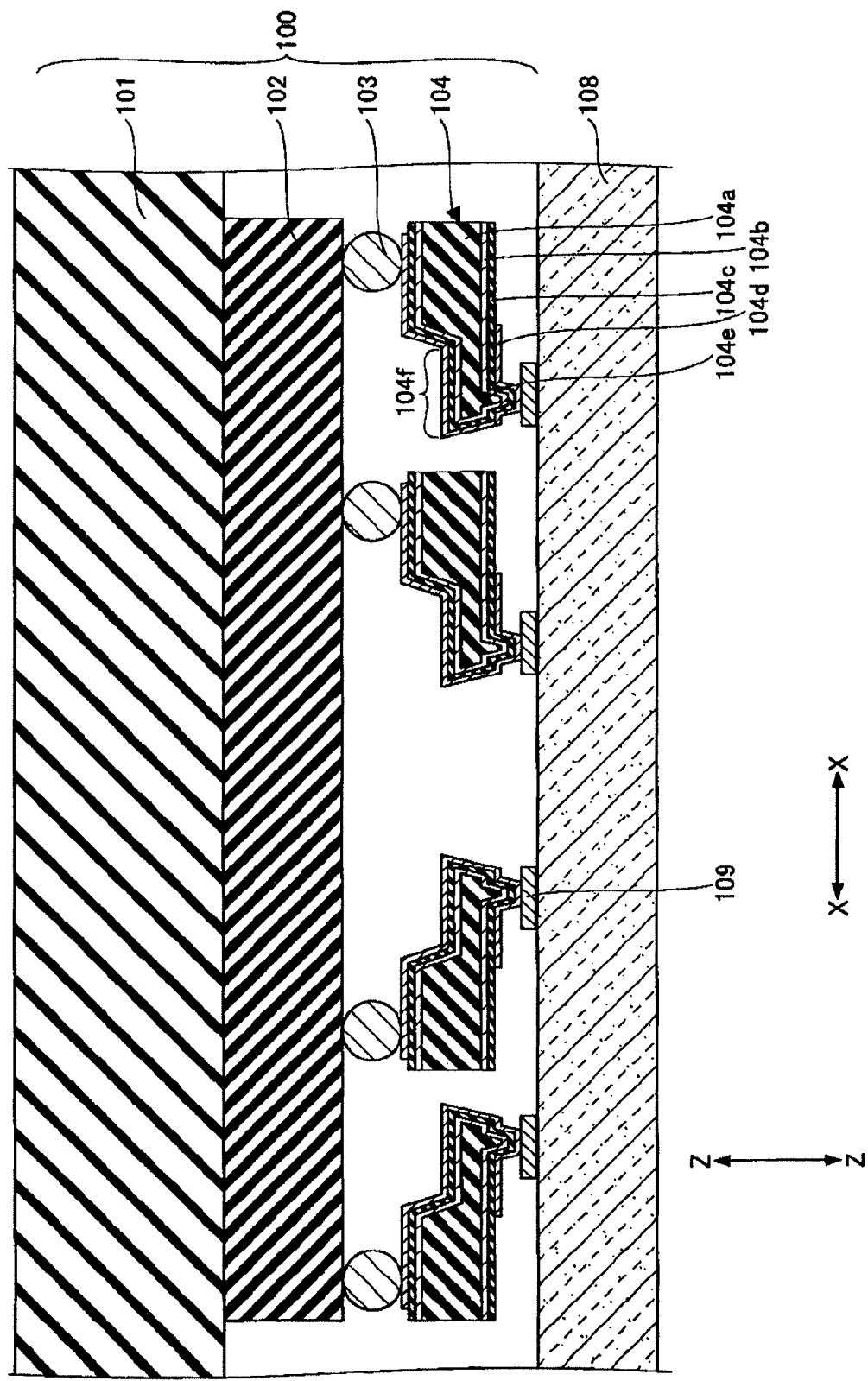
FIG. 1 is a sectional view illustrating a related-art semiconductor inspecting device 100.
Figure 2:
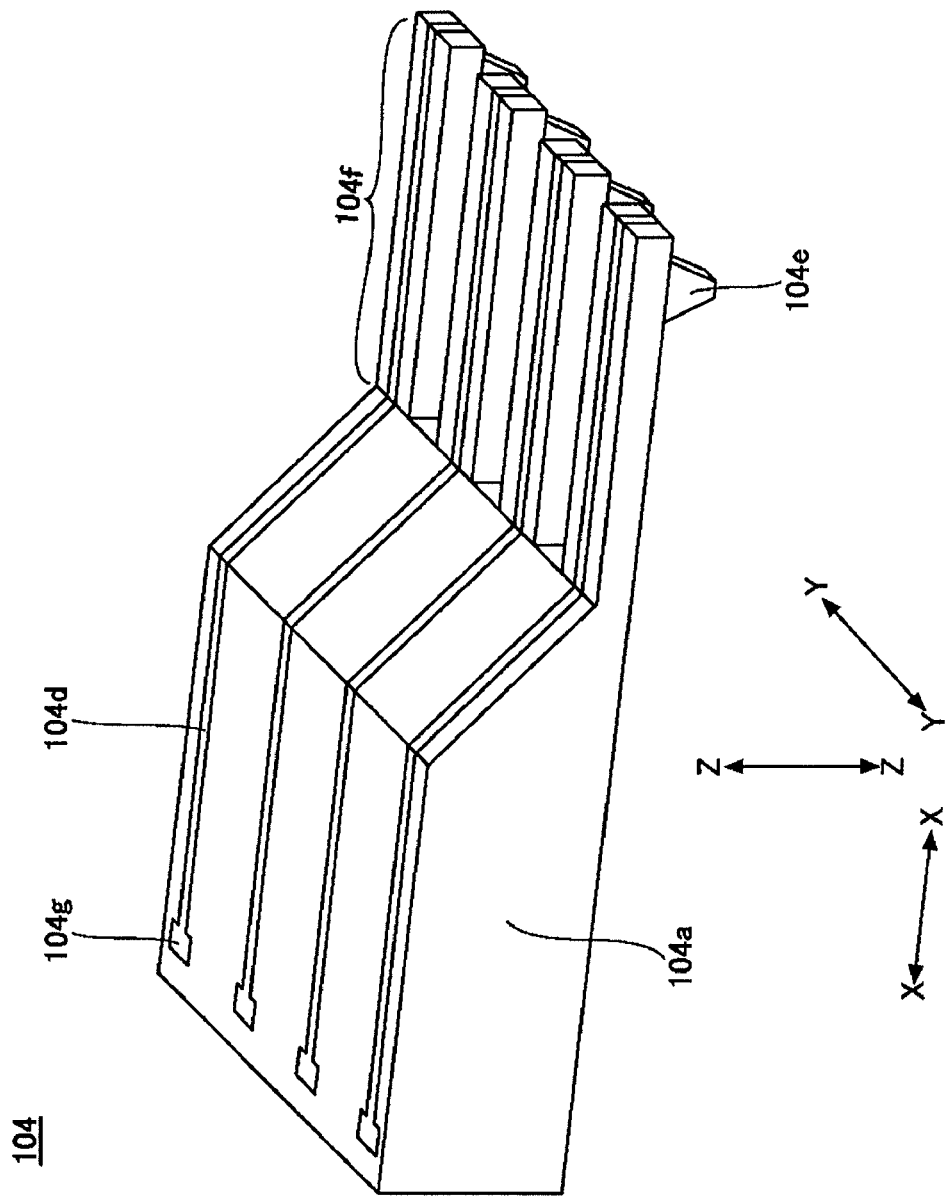
FIG. 2 is a perspective view illustrating a probe 104 constituting the related-art semiconductor inspecting device 100.
Figure 3:
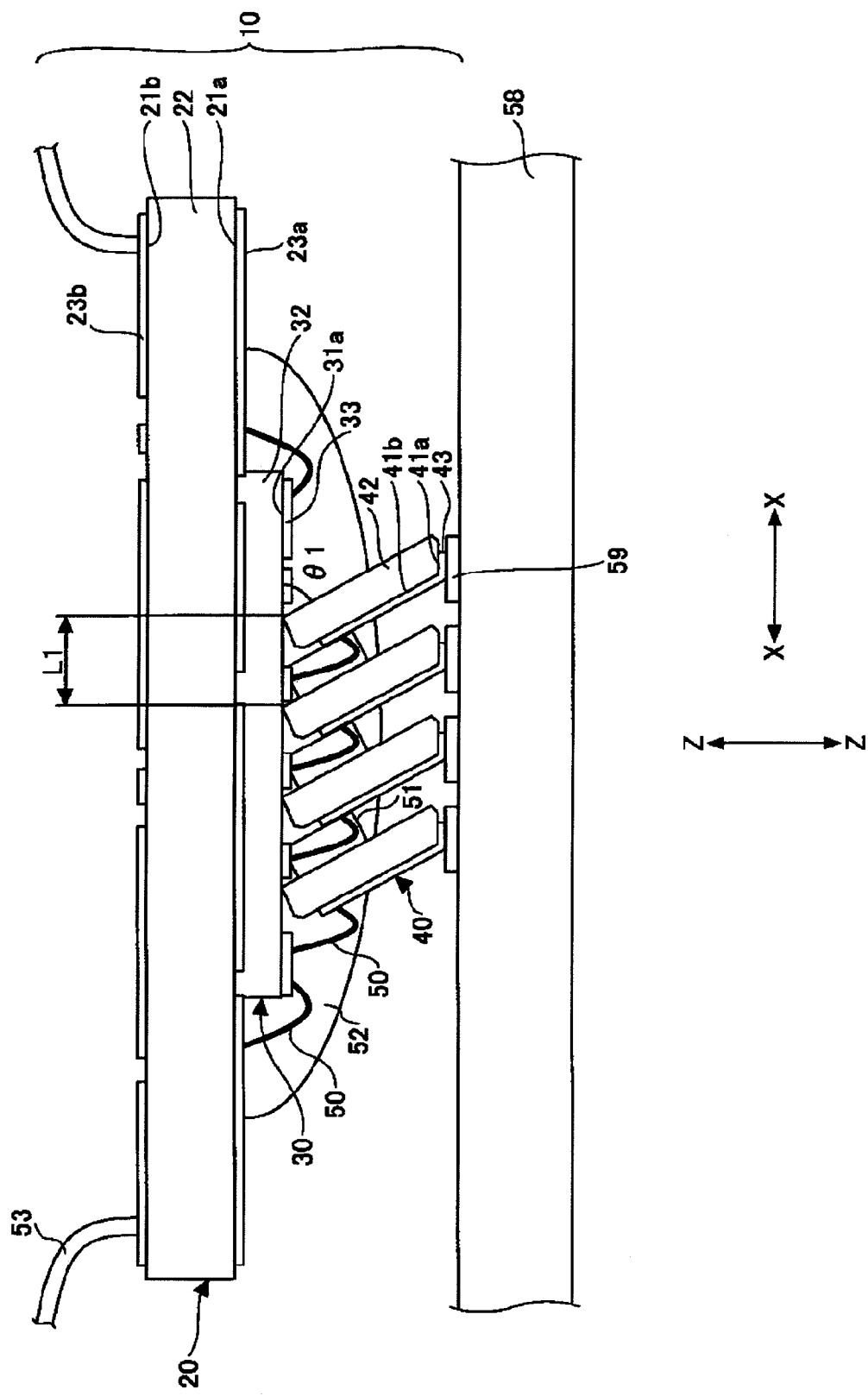
FIG. 3 is a front view illustrating a semiconductor inspecting device 10 according to a first embodiment of the invention.
Figure 4:
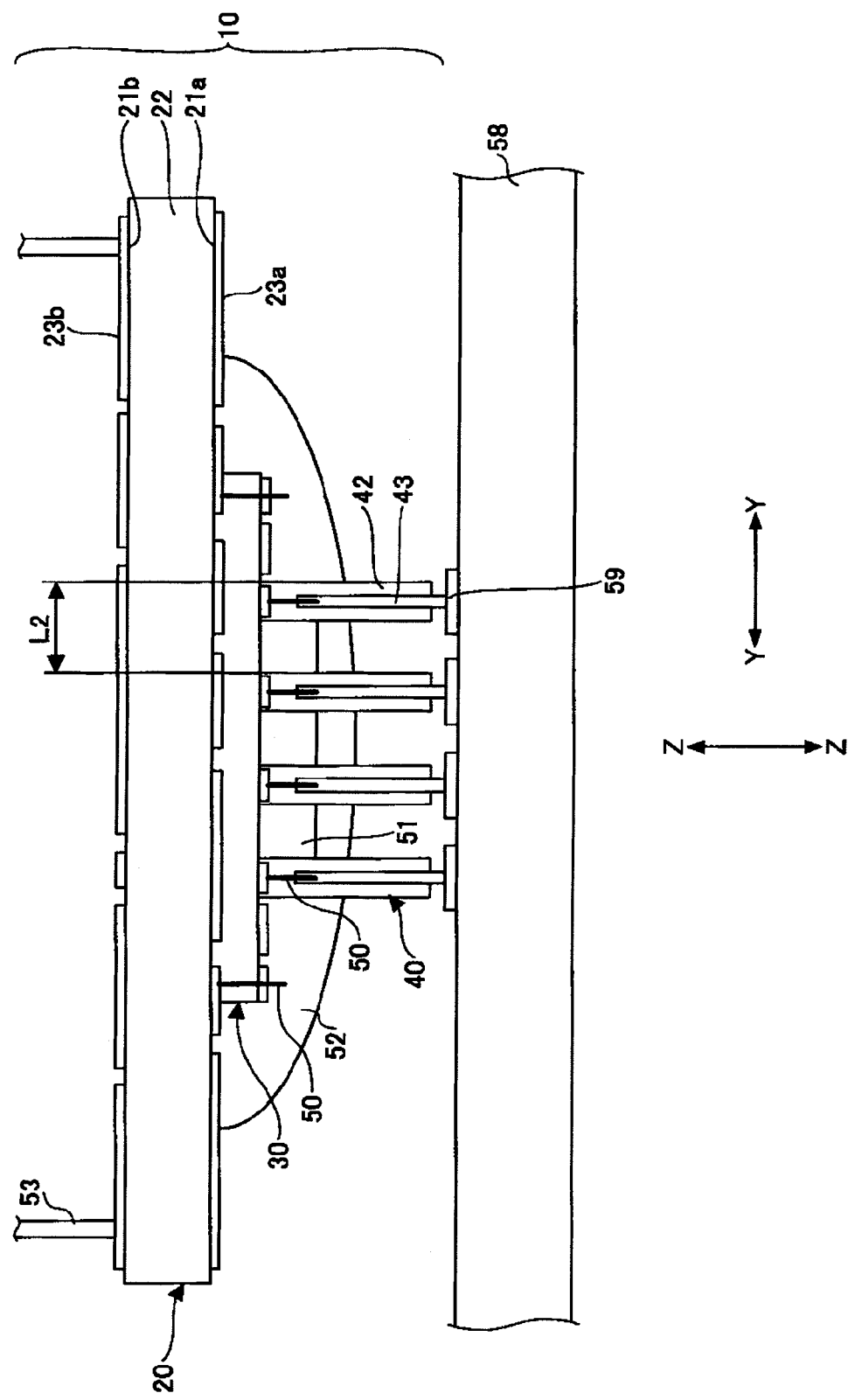
FIG. 4 is a left side view illustrating the semiconductor inspecting device 10 according to the first embodiment of the invention.
Figure 5:
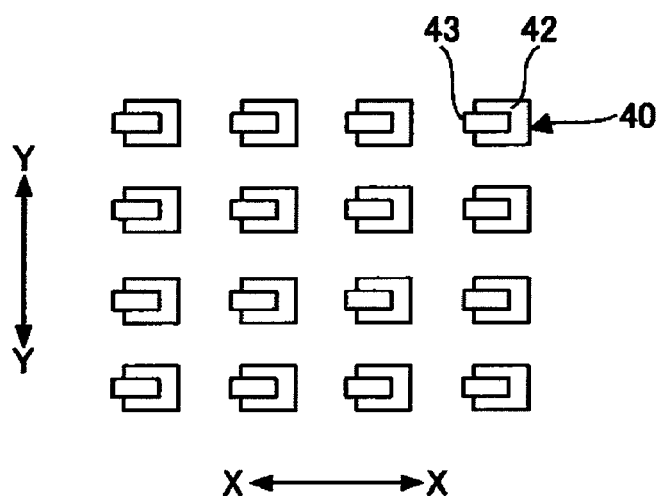
FIG. 5 is a bottom view illustrating an array of a probe 40 in the semiconductor inspecting device 10 according to the first embodiment of the invention.
Figure 6:
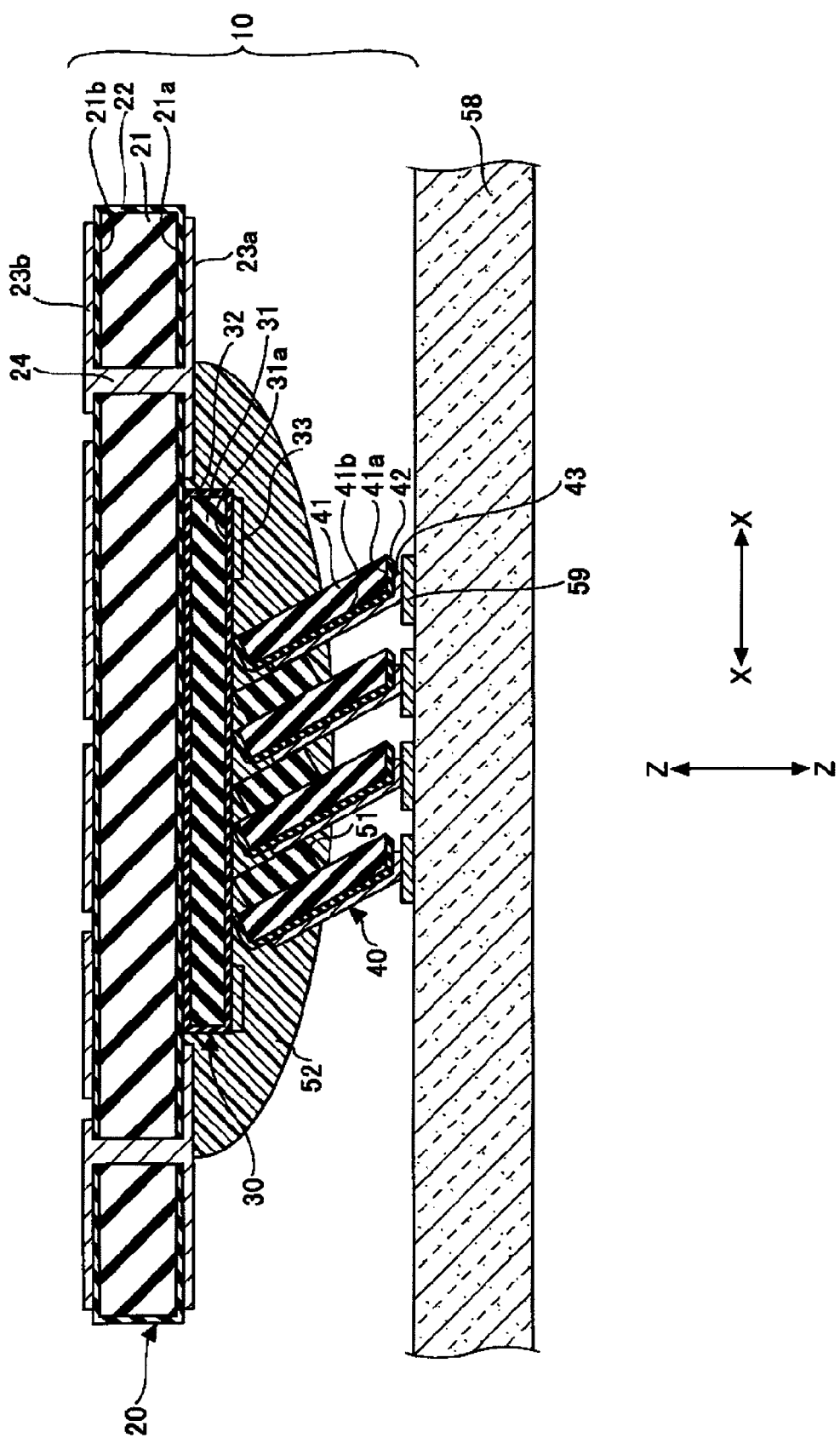
FIG. 6 is a sectional view illustrating the semiconductor inspecting device 10 according to the first embodiment of the invention.

FIG. 3 is a front view illustrating a semiconductor inspecting device 10 according to a first embodiment of the invention. FIG. 4 is a left side view illustrating the semiconductor inspecting device 10 according to the first embodiment of the invention. FIG. 5 is a bottom view illustrating an array of a probe 40 in the semiconductor inspecting device 10 according to the first embodiment of the invention. FIG. 6 is a sectional view illustrating the semiconductor inspecting device 10 according to the first embodiment of the invention.

With reference to FIGS. 3 to 6, the semiconductor inspecting device 10 has a support board 20, a relay board 30, a probe 40, a bonding wire 50, a spacer 51, a sealing portion 52, and a connecting cable 53. A semiconductor device 58 has an electrode pad 59.

The relay board 30 is provided on a lower surface of the support board 20, and 16 probes 40 are provided on a lower surface of the relay board 30. The semiconductor inspecting device 10 has a mechanism (not shown) which can be moved in a Z-Z direction. In the case in which the semiconductor inspecting device 10 is moved toward the semiconductor device 58 side in the Z-Z direction, the probe 40 of the semiconductor inspecting device 10 comes in contact with the electrode pad 59 of the semiconductor device 58 and they are electrically connected to each other.

The support board 20 has a mother board 21, an insulating layer 22, wirings 23a and 23b, and a through hole 24. The mother board 21 has a lower surface 21a and an upper surface 21b. The mother board implies a substrate on which neither an insulating layer nor a wiring are formed (the following is the same). The insulating layer 22 is formed on the mother board 21. As a material of the mother board 21, for example, it is possible to use silicon or ceramic. As a material of the insulating layer 21, for example, it is possible to use $SiO_2$.

The wiring 23a is formed on the lower surface 21a of the mother board 21 through the insulating layer 22. The wiring 23b is formed on the upper surface 21b of the mother board 21 through the insulating layer 22. The wirings 23a and 23b are electrically connected to each other via the through hole 24. As materials of the wirings 23a and 23b, for example, it is possible to use Cu or Al.

The relay board 30 has a mother board 31, an insulating layer 32 and a wiring 33. The mother board 31 has a lower surface 31a. The insulating layer 32 is formed on the mother board 31. As a material of the mother board 31, for example, it is possible to use silicon or ceramic. As a material of the insulating layer 32, for example, it is possible to use $SiO_2$. The wiring 33 is formed on the lower surface 31a of the mother board 31 through the insulating layer 32. As a material of the wiring 33, for example, it is possible to use Cu or Al.

The probe 40 is a contact which has a mother board 41, an insulating layer 42 and a wiring 43 and is electrically connected to the electrode pad 59 of the semiconductor device 58 which is an object to be measured. The mother board 41 has a lower surface 41a and a side surface 41b. The insulating layer 42 is formed on the mother board 41. For a material of the mother board 41, a single silicon crystal is used. By using the single silicon crystal, it is possible to form the probe 40 in which various characteristics such as a spring constant are uniform.

As a material of the insulating layer 42, for example, it is possible to use $SiO_2$. The wiring 43 is formed on the lower surface 41a and the side surface 41b in the mother board 41 through the insulating layer 42. As a material of the wiring 43, for example, it is possible to use Cu or Al.

The probe 40 is disposed in a matrix having four rows and four columns in X-X and Y-Y directions as shown in FIG. 5 seen from a bottom face and 16 probes 40 in total are provided obliquely to the lower surface to be a main surface of the relay board 30. The matrix implies a state of vertically and horizontally regular order which does not need to be straight. An angle θ1 formed by the probe 40 and a lower surface of the relay board 30 can be set to be 30 to 60 degrees, for example. The adjacent probes 40 are separated from each other through the spacer 51. As a material of the spacer 51, for example, it is possible to use silicon or glass.

The relay board 30, the bonding wire 50, the spacer 51 and a portion of the probe 40 which is close to the lower surface of the relay board 30 are sealed with the sealing portion 52. The probe 40 is provided obliquely to the lower surface to be the main surface of the relay board 30 for the following reason. When the wiring 43 corresponding to the lower surface 41a of the mother board 41 in the probe 40 comes in contact with the electrode pad 59 of the semiconductor device 58 which is the object to be measured, the probe 40 is deflected so that a spring property is generated and the wiring 43 corresponding to the lower surface 41a of the mother board 41 in the probe 40 is pushed at a proper pressure against the electrode pad 59 of the semiconductor device 58 which is the object to be measured, resulting in an implementation in a stable and electrical connection. A quantity of the deflection of the probe 40 is approximately 10 μm, for example.

In an inspection of an electrical characteristic of the semiconductor device 58, the semiconductor inspecting device 10 is moved toward the semiconductor device 58 side in the Z-Z direction, and the wiring 43 corresponding to the lower surface 41a of the mother board 41 in the probe 40 of the semiconductor inspecting device 10 comes in contact with the electrode pad 59 of the semiconductor device 58 which is the object to be measured and is electrically connected to the electrode pad 59. A shape of a portion in the probe 40 which comes in contact with the electrode pad 59 of the semiconductor device 58 to be the measured object is not restricted to the shape shown in FIG. 3 but may be a taper shape or a shape obtained by rounding a corner portion of the taper shape.

The wirings 23a, 33 and 43 are electrically connected through the bonding wire 50. Moreover, the connecting cable 53 connects the wiring 23b to an external testing device (not shown). Thus, the wiring 43 corresponding to the lower surface 41a of the mother board 41 in the probe 40 is caused to come in contact with the electrode pad 59 of the semiconductor device 58 to be the measured object at a proper pressure. Consequently, the electrode pad 59 of the semiconductor device 58 is electrically connected to the external testing device (not shown) via the wiring 43, the wiring 33, the wiring 23a, the wiring 23b, the bonding wire 50 and the connecting cable 53, Thus, it is possible to inspect an electrical characteristic of the semiconductor device 58.

As described above, in the related-art semiconductor inspecting device 100, the probe 104 is provided with the cantilever portion 104f which can easily be deformed, and the protruded portion 104e is formed in the tip part of the cantilever portion 104f or the vicinity thereof. When the wiring 104d in the protruded portion 104e is electrically connected to the electrode pad 109 of the semiconductor device 108 which is the object to be measured, the cantilever portion 104f is deflexed so that the spring property is generated and the wiring 104d in the protruded portion 104e can be pushed against the electrode pad 109 at a proper pressure, resulting in an implementation of a stable and electrical connection.

In the semiconductor inspecting device 10 according to the first embodiment of the invention, the cantilever portion 104f is not provided but the probe 40 is provided obliquely to the lower surface of the relay board 30 to generate the spring property in the probe 40. Thus, an interval L1 in the x-x direction of the probe 40 provided adjacently to the lower surface of the relay board 30 can be reduced considerably as compared with the related-art semiconductor inspecting device 100. Moreover, a portion corresponding to the cantilever portion 104f is not provided in the Y-Y direction. Therefore, an interval L2 in the Y-Y direction of the probe 40 provided adjacently to the lower surface of the relay board 30 can also be set to be almost equal to L1. For example, L1 and L2 are approximately 30 μm. It is possible to implement an increase in the number of pitches and a reduction in a pitch which correspond to a full matrix having more than several thousand pins.

Next, description will be given to a method of manufacturing the probe 40 according to the first embodiment of the invention. FIGS. 7 to 16 are views showing a process for manufacturing the probe 40 according to the first embodiment of the invention. In FIGS. 7 to 16, the same components as those in FIGS. 3 to 6 have the same reference numerals and description thereof will be omitted. FIGS. 7 to 16 show an example of the case in which two probes 40 are manufactured.

Figure 7:
FIG. 7 is a view (No. 1) showing a process for manufacturing the probe 40 according to the first embodiment of the invention.
Figure 8:
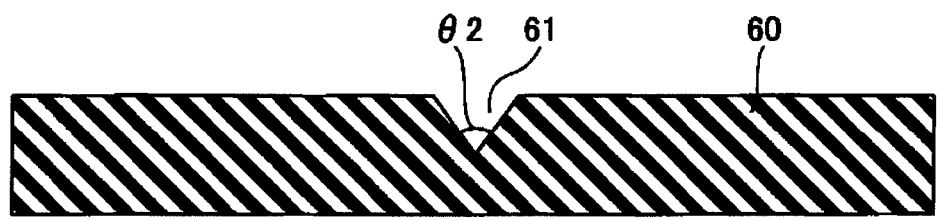
FIG. 8 is a view (No. 2) showing the process for manufacturing the probe 40 according to the first embodiment of the invention.

First of all, at a step shown in FIG. 7, a silicon substrate 60 is prepared. The silicon substrate 60 is formed by a single silicon crystal. A thickness T1 of the silicon substrate 60 is 625 μm in case of φ6 inches and is 725 μm in case of φ8 inches, for example. At a step shown in FIG. 8, subsequently, a V groove portion 61 is formed on an almost center in a longitudinal direction of the silicon substrate 60. The V groove portion 61 can be formed by dicing or chemical etching, for example. An angle θ2 of the V groove portion 61 can be set to be 60 to 120 degrees, for example.

Figure 9:
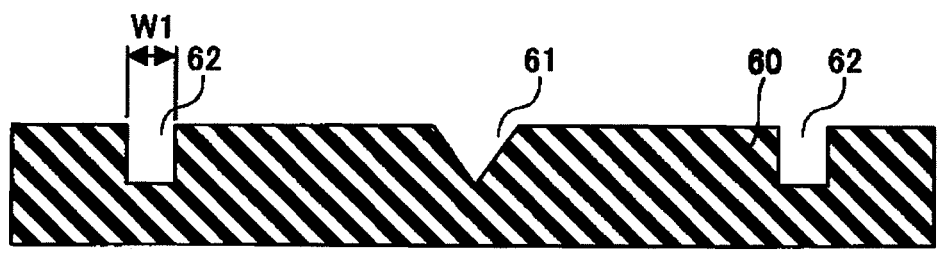
FIG. 9 is a view (No. 3) showing the process for manufacturing the probe 40 according to the first embodiment of the invention.

At a step shown in FIG. 9, then, a square groove portion 62 is formed in the longitudinal direction of the silicon substrate 60. The square groove portion 62 is formed in two positions which are symmetrical with respect to the V groove portion 61. A width W1 of the square groove portion 62 can be set to be 5 μm to 100 μm, for example. The square groove portion 62 can be formed by the Deep-RIE (Reactive Ion Etching) processing, for example. According to the Deep-RIE (Reactive Ion Etching) processing, it is possible to carry out the processing with high precision of approximately ±1 μm.

Figure 10:
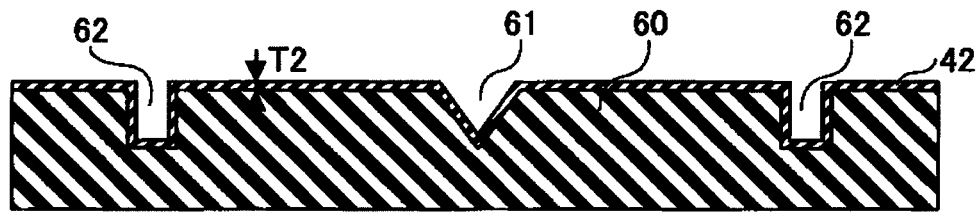
FIG. 10 is a view (No. 4) showing the process for manufacturing the probe 40 according to the first embodiment of the invention.
Figure 11:
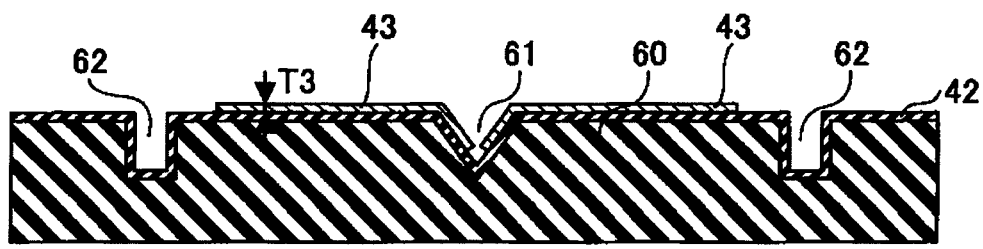
FIG. 11 is a view (No. 5) showing the process for manufacturing the probe 40 according to the first embodiment of the invention.

At a step shown in FIG. 10, thereafter, the insulating layer 42 is formed on a surface of the silicon substrate 60. As a material of the insulating layer 42, for example, it is possible to use $SiO_2$. A thickness T2 of the insulating layer 42 can be set to be 0.1 μm to 1.5 μm, for example. At a step shown in FIG. 11, next, the wiring 43 is formed on the insulating layer 42. As a material of the wiring 43, for example, it is possible to use Cu or Al. A thickness T3 of the wiring 43 can be set to be 0.1 μm to 0.5 μm, for example. The wiring 43 can be formed by a subtractive method or a semiadditive method, for example.

Figure 12:
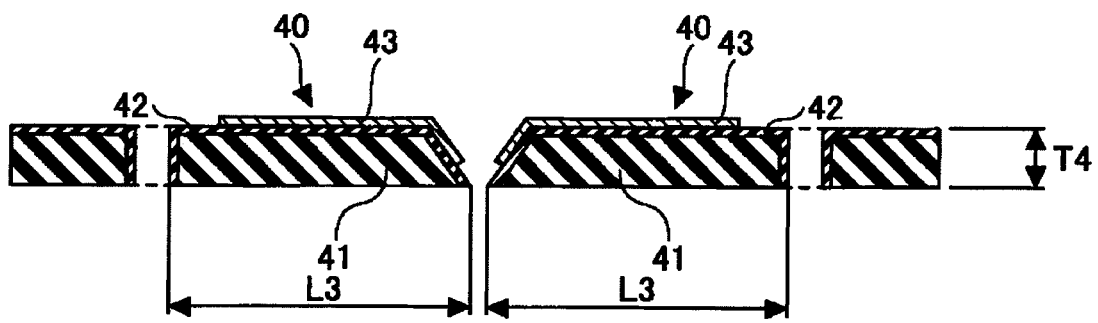
FIG. 12 is a view (No. 6) showing the process for manufacturing the probe 40 according to the first embodiment of the invention.

At a step shown in FIG. 12, subsequently, the silicon substrate 60 is abraded or ground from a back side thereof to reduce a thickness of the silicon substrate 60 so that two probes 40 are fabricated. In order to reduce the thickness of the silicon substrate 60, it is possible to use a back side grinder, for example. A thickness T4 of the silicon substrate 60 having the thickness reduced (a thickness of the probe 40) can be set to be 10 μm to 100 μm, for example.

Figure 13:
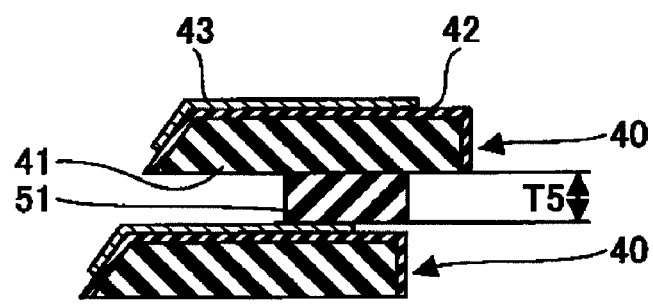
FIG. 13 is a view (No. 7) showing the process for manufacturing the probe 40 according to the first embodiment of the invention.
Figure 14:
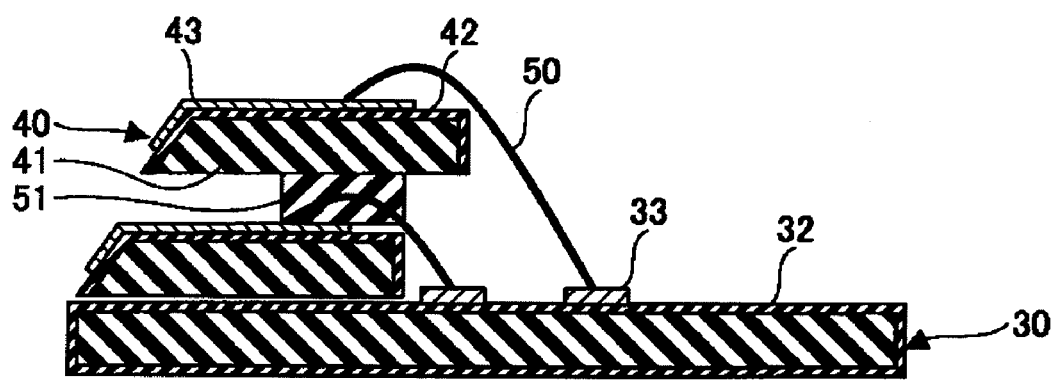
FIG. 14 is a view (No. 8) showing the process for manufacturing the probe 40 according to the first embodiment of the invention.

At a step shown in FIG. 13, then, the spacer 51 is fixed between the adjacent probes 40. The probe 40 and the spacer 51 are fixed to each other with an adhesive, for example. As a material of the spacer 51, for example, it is possible to use silicon or glass. A thickness T5 of the spacer 51 can be set to be 150 μm, for example. At a step shown in FIG. 14, thereafter, there is prepared the relay board 30 on which the wiring 33 is formed through the insulating layer 32. The wiring 33 of the relay board 30 and the wiring 43 of the probe 40 are electrically connected to each other through the bonding wire 50.

Figure 15:
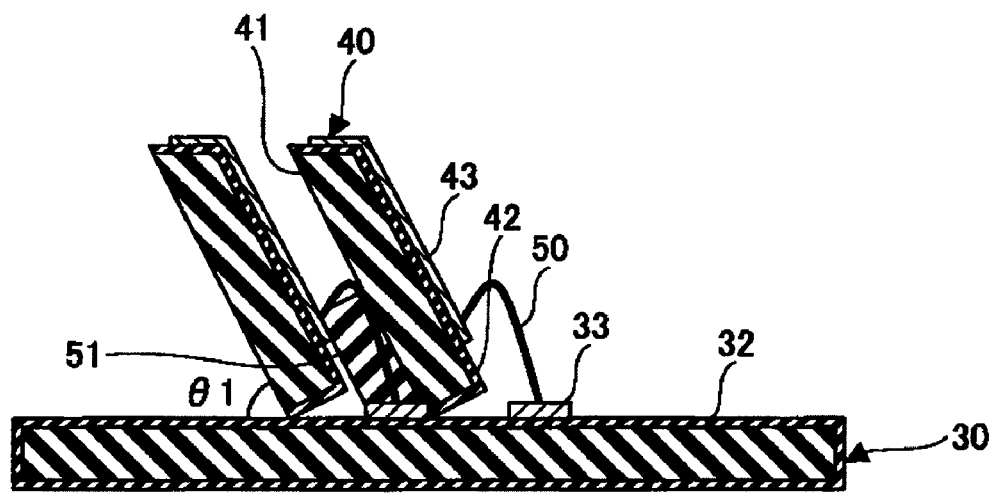
FIG. 15 is a view (No. 9) showing the process for manufacturing the probe 40 according to the first embodiment of the invention.
Figure 16:
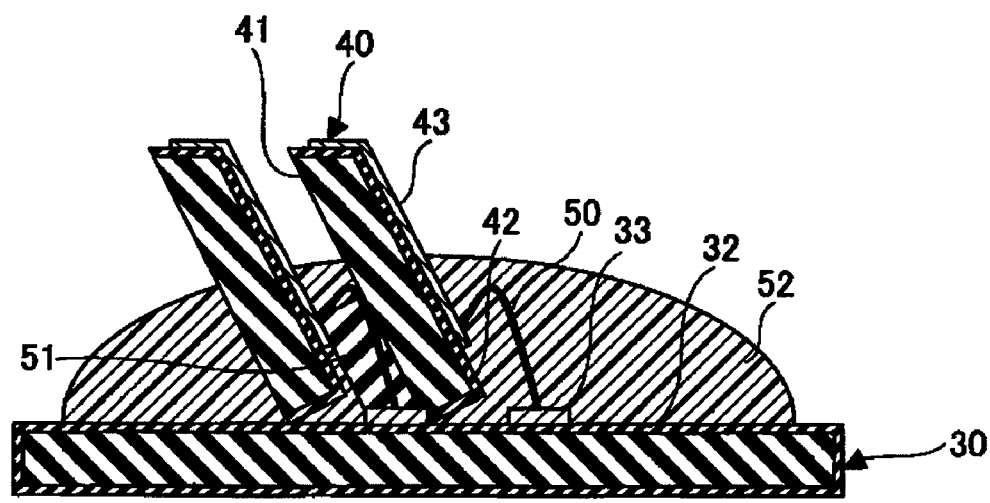
FIG. 16 is a view (No. 10) showing the process for manufacturing the probe 40 according to the first embodiment of the invention.

At a step shown in FIG. 15, subsequently, the probe 40 is erected on the relay board 30 at the predetermined angle θ1. The angle θ1 formed by the probe 40 and the relay board 30 can be set to be 30 to 60 degrees, for example. At a step shown in FIG. 16, next, the portion of the probe 40 which is close to the relay board 30 is sealed with the sealing portion 52. As a material of the sealing portion 52, for example, it is possible to use an epoxy resin. Thus, the probe 40 can be fabricated and can be provided on the relay board 30.

According to the semiconductor inspecting device 10 in accordance with the first embodiment of the invention, there is employed a probe structure in which the probe 40 is provided obliquely to the lower surface of the relay board 30 to generate the spring property in the probe 40, thereby connecting the probe 40 to the semiconductor device 58 electrically. Consequently, it is possible to increase the number of pins and to reduce a pitch in the X-X and Y-Y directions.

Second Embodiment

Figure 17:
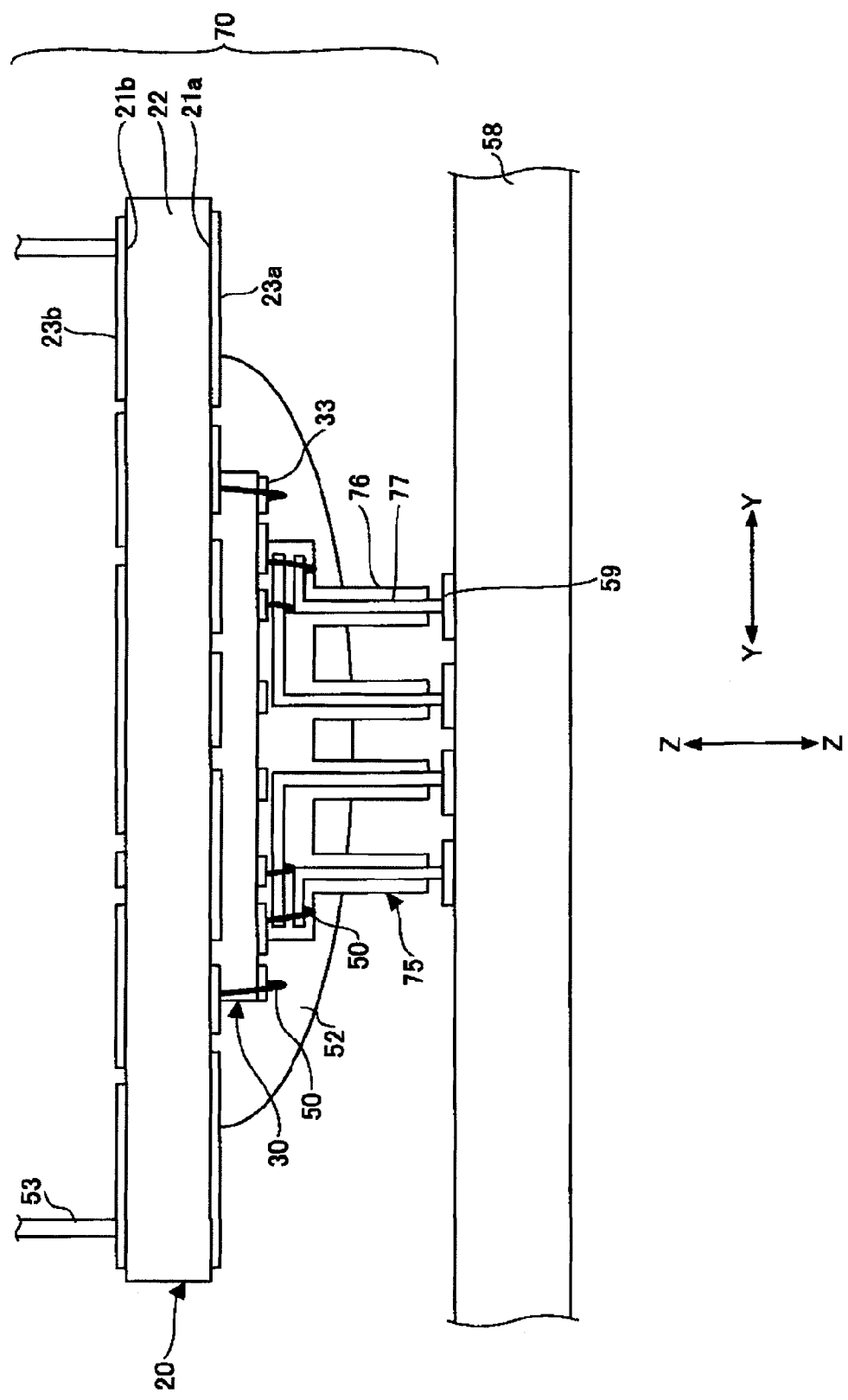
FIG. 17 is a left side view illustrating a semiconductor inspecting device 70 according to a second embodiment of the invention.

FIG. 17 is a left side view illustrating a semiconductor inspecting device 70 according to a second embodiment of the invention. Since plan and sectional views illustrating the semiconductor inspecting device 70 according to the second embodiment of the invention and a bottom view illustrating an array of a probe 75 in the semiconductor inspecting device 70 according to the second embodiment of the invention are identical to FIGS. 3, 5 and 6 illustrating the semiconductor inspecting device 10 according to the first embodiment of the invention, the drawings and description will be omitted.

With reference to FIG. 17, the semiconductor inspecting device 70 according to the second embodiment of the invention has the same structure as the semiconductor inspecting device 10 except that the probe 75 is provided on a relay board 30 in place of the probe 40 in the semiconductor inspecting device 10 according to the first embodiment and a spacer 51 is not provided between the adjacent probes 75 in a Y-Y direction.

The probe 75 shown in FIG. 17 is formed integrally corresponding to a single column in the Y-Y direction and a wiring 77 is formed on an insulating layer 76. The wiring 77 of the probe 75 and a wiring 33 of the relay board 30 are electrically connected to each other through a bonding wire 50. The probe 75 is formed integrally corresponding to a single column in the Y-Y direction so that the spacer 51 does not need to be provided between the adjacent probes 75 in the Y-Y direction. A method of manufacturing the probe 75 is executed in accordance with the method of manufacturing the probe 40 shown in FIGS. 7 to 16. By the Deep-RIE (Reactive Ion Etching) processing, for example, it is possible to form a portion in which a single column in the Y-Y direction of the probe 75 is provided integrally.

According to the semiconductor inspecting device 70 in accordance with the second embodiment of the invention, there is employed a probe structure in which the probe 75 is provided obliquely to a lower surface of the relay board 30 to generate a spring property in the probe 75 and the probe 75 and a semiconductor device 58 are electrically connected to each other. In the same manner as in the semiconductor inspecting device 10 according to the first embodiment of the invention, consequently, it is possible to increase the number of pins and to reduce a pitch in X-X and Y-Y directions.

Third Embodiment

Figure 18:
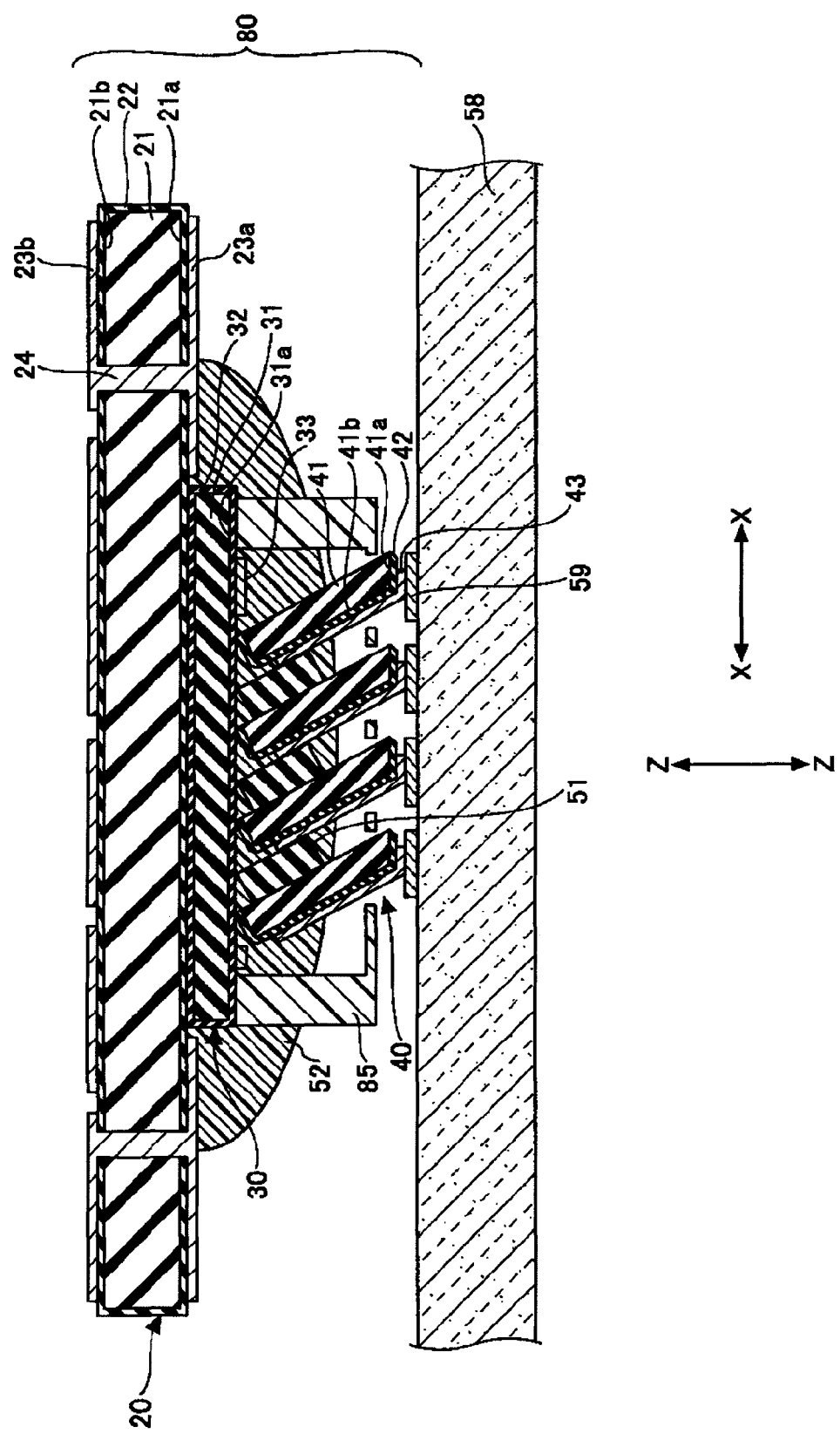
FIG. 18 is a sectional view illustrating a semiconductor inspecting device 80 according to a third embodiment of the invention.

FIG. 18 is a sectional view illustrating a semiconductor inspecting device 80 according to a third embodiment of the invention. With reference to FIG. 18, the semiconductor inspecting device 80 according to the third embodiment of the invention has the same structure as the semiconductor inspecting device 10 according to the first embodiment except that a probe positioning portion 85 is additionally provided on the lower surface of the relay board 30 in the semiconductor inspecting device 10. FIG. 19 is a bottom view illustrating only a probe 40 and the probe positioning portion 85 in the semiconductor inspecting device 80.

Figure 19A:
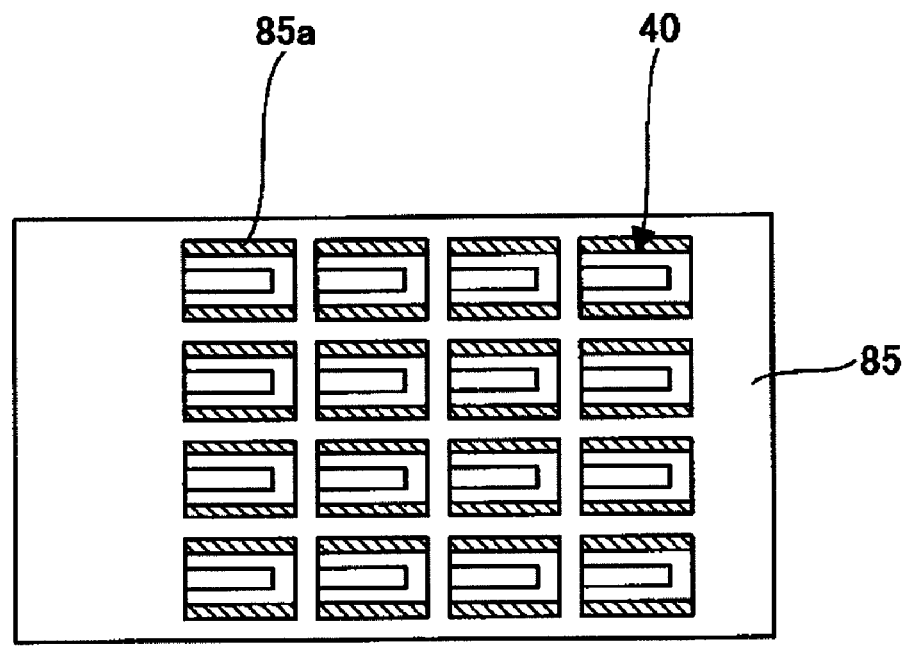
FIGS. 19A and 19B are bottom views illustrating only a probe 40 and a probe positioning portion 85 in the semiconductor inspecting device 80.
Figure 19B:
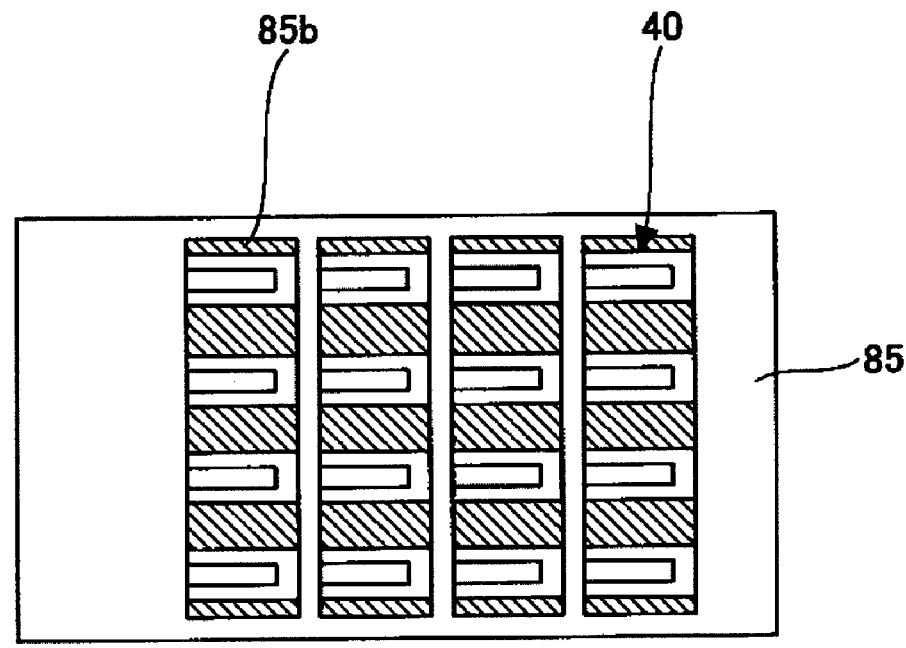

With reference to FIG. 19, a through hole 85a or 85b for inserting the probe 40 therein is formed at a regular interval in the probe positioning portion 85. The probe positioning portion 85 may be provided with 16 through holes 85a in a matrix in order to separate 16 probes 40 respectively in a correspondence of a single hole to the single probe 40 as shown in FIG. 19A or may be provided with four through holes 85b like a slit in order to separate the probes 40 in four columns respectively in a correspondence of a single hole to the probes 40 for a single column as shown in FIG. 19B.

By providing the probe positioning portion 85 on the lower surface of the relay board 30, it is possible to align tip parts of the probes 40, thereby maintaining a certain pitch (interval). Moreover, the probe positioning portion 85 also serves as a stopper to be stopped in a predetermined position when the semiconductor inspecting device 80 is moved toward a semiconductor device 58 side in a Z-Z direction. More specifically, by providing the probe positioning portion 85 on the lower surface of the relay board 30, it is possible to prevent an interval between the relay board 30 and the semiconductor device 58 from being smaller than a predetermined value. Therefore, it is possible to prevent the probe 40 from being broken due to excessive push-in.

According to the semiconductor inspecting device 80 in accordance with the third embodiment of the invention, there is employed a probe structure in which the probe 40 is provided obliquely to the lower surface of the relay board 30 to generate a spring property in the probe 40 and the probe 40 and the semiconductor device 58 are electrically connected to each other. In the same manner as in the semiconductor inspecting device 10 according to the first embodiment of the invention, consequently, it is possible to increase the number of pins and to reduce a pitch in X-X and Y-Y directions.

By providing the probe positioning portion 85 on the lower surface of the relay board 30, furthermore, it is possible to maintain the tip part of the probe 40 to have a certain pitch. In addition, by the provision of the probe positioning portion 85 on the lower surface of the relay board 30, the probe positioning portion 85 serves as the stopper to be stopped in the predetermined position when the semiconductor inspecting device 80 is moved toward the semiconductor device 58 side in the Z-Z direction. Therefore, it is possible to prevent the probe 40 from being broken due to the excessive push-in.

Fourth Embodiment

Figure 20:
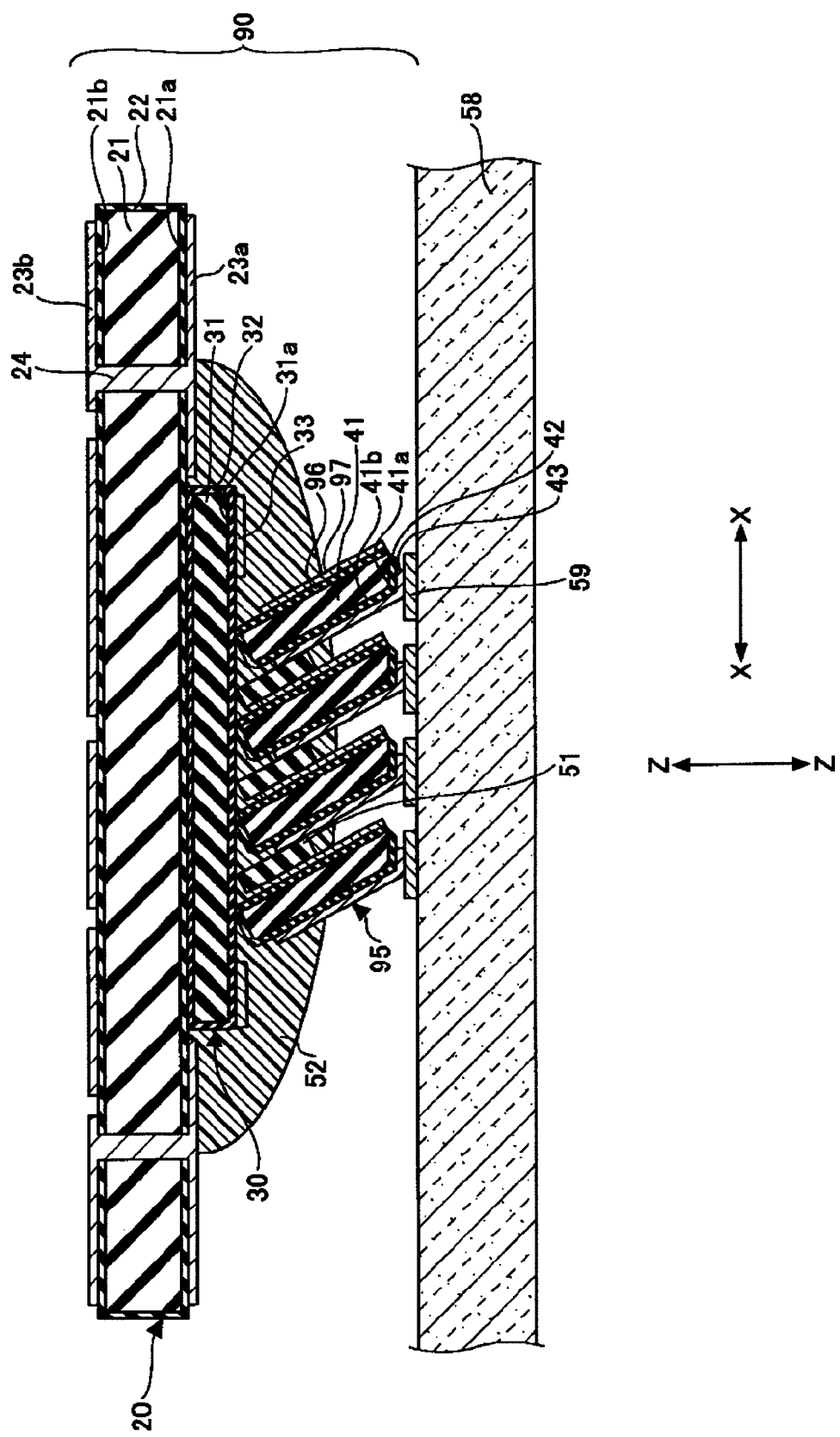
FIG. 20 is a sectional view illustrating a semiconductor inspecting device 90 according to a fourth embodiment of the invention.

FIG. 20 is a sectional view illustrating a semiconductor inspecting device 90 according to a fourth embodiment of the invention. With reference to FIG. 20, the semiconductor inspecting device 90 according to the fourth embodiment of the invention has the same structure as the semiconductor inspecting device 10 except that a probe 95 is formed in place of the probe 40 in the semiconductor inspecting device 10 according to the first embodiment.

In the probe 95, an insulating layer 96 is formed on a side surface at an opposite side to a side surface on which a wiring 43 is formed, and a resistor 97 is further formed on the insulating layer 96. As a material of the insulating layer 96, for example, it is possible to use $SiO_2$. As the resistor 97, for example, it is possible to use W (tungsten).

The resistor 97 is electrically connected to a wiring 33 of a relay board 30 through a bonding wire (not shown), and furthermore, is electrically connected to an external testing device (not shown) via a bonding wire 50 (not shown), a wiring 23a and a wiring 23b in a support board 20, and a connecting cable 53 (not shown). The resistor 97 functions as a heater (a heating unit) for heating the probe 95. More specifically, a predetermined current is caused to flow to the resistor 97 from the external testing device (not shown) so that heat is generated from the resistor 97 and is transferred to the probe 95. Thus, the probe 95 is brought to have a predetermined temperature.

The heat transferred to the probe 95 is further transferred through an electrode pad 59 to a semiconductor device 58 which is an object to be measured. Consequently, it is possible to cause the temperature of the probe 95 and that of the semiconductor device 58 including the electrode pad 59 to be a predetermined equal temperature. Thus, it is possible to prevent a positional shift of the probe 95 and the electrode pad 59 of the semiconductor device 58 due to an inequality of the temperature of the probe 95 and that of the semiconductor device 58 including the electrode pad 59. In place of the resistor 97 functioning as the heater (the heating unit) for heating the probe 95 or in addition to the resistor 97, it is also possible to provide the heater (the heating unit) on the relay board 30.

A method of manufacturing the probe 95 is executed in accordance with the method of manufacturing the probe 40 shown in FIGS. 7 to 16. In case of the probe 95, however, there are further required a step of forming the insulating layer 96, a step of forming the resistor 97 on the insulating layer 96, and a step of electrically connecting the resistor 97 and the wiring 33 through the bonding wire 50.

According to the semiconductor inspecting device 90 in accordance with the fourth embodiment of the invention, there is employed a probe structure in which the probe 95 is provided obliquely to a lower surface of the relay board 30 to generate a spring property in the probe 95 and the probe 95 and the semiconductor device 58 are electrically connected to each other. In the same manner as in the semiconductor inspecting device 10 according to the first embodiment of the invention, consequently, it is possible to increase the number of pins and to reduce a pitch in X-X and Y-Y directions.

Moreover, the resistor 97 functioning as the heater (the heating unit) and formed of W (tungsten), for example, is provided in the probe 95, and a current is caused to flow to the resistor 97, thereby generating a heat to set the temperature of the probe 95 and that of the semiconductor device 58 including the electrode pad 59 to be equal to each other. Thus, it is possible to prevent the positional shift of the probe 95 from the electrode pad 59 of the semiconductor device 58 due to the inequality of the temperature of the probe 95 and that of the semiconductor device 58 including the electrode pad 59.

Although the preferred embodiments according to the invention have been described above in detail, the invention is not restricted to the embodiments but various modifications and changes can be made to the embodiments without departing from the scope of the invention.

For example, it is also possible to provide at least 17 probes 40, 75 or 95 on the lower surface of the relay board 30 in the semiconductor inspecting device 10 according to the first embodiment of the invention, the semiconductor inspecting device 70 according to the second embodiment of the invention, the semiconductor inspecting device 80 according to the third embodiment of the invention or the semiconductor inspecting device 90 according to the fourth embodiment of the invention.

Moreover, it is also possible to employ a structure in which the probe positioning portion 85 is provided on the lower surface of the relay board 30 in the semiconductor inspecting device 70 according to the second embodiment of the invention or the semiconductor inspecting device 90 according to the fourth embodiment of the invention.

In each of the embodiments according to the invention, furthermore, it is also possible to employ a structure in which the support board 20 and the relay board 30 are formed to be a single board and the probe 40, 75 or 95 may be provided on a main surface thereof.

What is claimed is:

1. A semiconductor inspecting device comprising:
   a support board;
   a relay board mounted to the support board;
   a plurality of contacts mounted to the relay board, the contacts to be electrically connected to electrode pads formed in a semiconductor device which is an object to be measured; and
   a contact positioning portion having a through hole and functioning as a stopper for preventing an interval between the substrate and the semiconductor device from being smaller than a predetermined value,
   wherein the contacts are provided obliquely to a main surface of the relay board and cantilevered from the main surface of the relay board,
   wherein the contacts are provided in a matrix over the main surface of the relay board,
   wherein the contacts corresponding to a single row or column are formed integrally,
   wherein the contacts have a substrate formed by a single silicon crystal, an insulating layer formed on the substrate, and a wiring formed on the insulating layer, the wiring being electrically connected through wire bonding to a wiring formed on the main surface of the relay board, and
   wherein adjacent contacts are separated from each other by a spacer provided between the contacts.

2. The semiconductor inspecting device according to claim 1, wherein a plurality of through holes is provided in a matrix in order to separate the respective contacts from each other.

3. The semiconductor inspecting device according to claim 1, wherein a plurality of through holes is formed like a slit in order to separate the contacts corresponding to one row or column from each other.

4. The semiconductor inspecting device according to claim 1, further comprising:
   a resistor provided on at least one of the contacts or the relay board, the resistor being a heater configured to heat the contact.

5. The semiconductor inspecting device according to claim 1, wherein an angle formed by the contacts and the main surface of the relay hoard is set to be 30 to 60 degrees.

* * * * *